(12) United States Patent
Pendse

(10) Patent No.: US 7,034,391 B2
(45) Date of Patent: Apr. 25, 2006

(54) FLIP CHIP INTERCONNECTION PAD LAYOUT

(75) Inventor: Rajendra D. Pendse, Fremont, CA (US)

(73) Assignee: ChipPAC, Inc., Fremont, CA (US)

( * ) Notice: Subject to any disclaimer, the term of this patent is extended or adjusted under 35 U.S.C. 154(b) by 0 days.

(21) Appl. No.: 10/983,898

(22) Filed: Nov. 8, 2004

(65) Prior Publication Data

US 2005/0098886 A1    May 12, 2005

Related U.S. Application Data

(60) Provisional application No. 60/518,434, filed on Nov. 8, 2003.

(51) Int. Cl.
*H01L 23/28* (2006.01)
*H01L 23/52* (2006.01)
*H01L 21/48* (2006.01)
*H05K 7/00* (2006.01)

(52) U.S. Cl. .................... 257/691; 257/778; 257/787; 438/111; 361/735; 361/760

(58) Field of Classification Search ................ 257/787, 257/778, 691; 361/735, 760; 438/111
See application file for complete search history.

(56) References Cited

U.S. PATENT DOCUMENTS 5,459,634 A * 10/1995 Nelson et al. ............ 361/306.3
5,606,358 A * 2/1997 Beaman .................... 347/237
5,633,785 A * 5/1997 Parker et al. ............... 361/766
6,111,756 A * 8/2000 Moresco .................... 361/735
6,407,462 B1 * 6/2002 Banouvong et al. ........ 257/787
6,433,441 B1 * 8/2002 Niwa et al. ................ 257/784
6,462,274 B1 * 10/2002 Shim et al. ................ 174/52.4
6,671,865 B1 * 12/2003 Ali et al. ...................... 716/8
6,713,686 B1 * 3/2004 Becker et al. .............. 174/262
6,769,108 B1 * 7/2004 Weekly ...................... 716/16

* cited by examiner

*Primary Examiner*—Long Pham
*Assistant Examiner*—Shrinivas H. Rao
(74) *Attorney, Agent, or Firm*—Bill Kennedy; Haynes Beffel & Wolfeld LLP

(57) ABSTRACT

A flip chip interconnect pad layout has the die signal pads are arranged on the die surface near the perimeter of the die, and the die power and ground pads arranged on the die surface inboard from the signal pads; and has the signal pads on the corresponding package substrate arranged in a manner complementary to the die pad layout and the signal lines routed from the signal pads beneath the die edge away from the die footprint, and has the power and ground lines routed to vias beneath the die footprint. Also, a flip chip semiconductor package in which the flip chip interconnect pad layouts have the die signal pads situated in the marginal part of the die and the die power and ground pads arranged on the die surface inboard from the signal pads, and the corresponding package substrates have signal pads arranged in a manner complementary to the die pad layout and signal lines routed from the signal pads beneath the die edge away from the die footprint.

16 Claims, 7 Drawing Sheets

FLIP CHIP INTERCONNECTION PAD LAYOUT

CROSS-REFERENCE TO RELATED APPLICATIONS

This application claims priority from U.S. Provisional Application No. 60/518,434, filed Nov. 8, 2003, titled "Flip chip interconnect pad layout".

BACKGROUND

This invention relates to semiconductor packaging and, particularly, to interconnect pad layout for flip chip interconnect.

Flip chip packages include a semiconductor die mounted onto a package substrate with the active side of the die facing the substrate. Interconnection of the circuitry in the die with circuitry in the substrate is made by way of bumps which are attached to an array of interconnect pads on the die, and bonded to a corresponding (complementary) array of interconnect pads on the substrate.

The pads on the die for the signal, power and ground functions of the die are conventionally distributed throughout the array, and the corresponding pads on the substrate are connected to appropriate circuitry to the external second level interconnects. The second level interconnects have a greater pitch than the flip chip interconnects, and so the routing on the substrate conventionally "fans out". The fan out routing between the pads on the die and the external pins of the package is formed on multiple metal layers within the package substrate.

Multiple layer substrates are expensive, and in conventional flip chip constructs the substrate alone typically accounts for more than half the package cost (about 60% in some typical instances).

In conventional flip chip constructs the escape routing pattern typically introduces additional electrical parasitics, because the routing includes short runs of unshielded wiring and vias between wiring layers in the signal transmission path. Electrical parasitics can significantly limit package performance.

SUMMARY

The invention is directed to flip chip interconnect pad layouts having all or substantially all the signal pads situated in the marginal part of the die, and corresponding package substrates.

According to the invention, the die signal pads are arranged on the die surface near the perimeter of the die, and the die power and ground pads are arranged on the die surface inboard from the signal pads. Also, according to the invention, the signal pads on the corresponding package substrate are arranged in a manner complementary to the die pad layout, and the signal lines are routed from the signal pads beneath the die edge away from the die footprint, and the power and ground lines are routed to vias beneath the die footprint.

The pad layouts provide for higher signal trace escape routing density at the chip margin. The package substrates have fewer metal layers, so that packages constructed using the pad layout of the invention can be made at significantly lower cost. Because there are fewer metal layers, and because the number of vias is reduced (and vias can be eliminated entirely from the signal transmission path), electrical parasitics are reduced, and the package can have improved performance.

In one general aspect the invention features a die pad layout for flip chip interconnect having signal pads located primarily near the perimeter of the die, and having ground and power pads located primarily inboard from the signal pads.

In some embodiments the signal pads are arranged in a row generally parallel to the die edge. Or, the signal pads are arranged in an array, as for example in two or more rows parallel to a die edge; in some such embodiments the pads in adjacent rows are staggered. The area of the die on which the row or array of signal pads is disposed may be referred to herein as a "peripheral region" of the die.

In some embodiments the ground and power pads are arranged in an array near the center of the die; in some such embodiments the ground and power pads are arranged in a rectangular array, and in some embodiments a central area of the die has no pads. Or, the power and ground pads are arranged near the signal pads; in some such embodiments the ground and power pads are arranged on a row parallel to the die edge, and in some embodiments the ground and power pads are arranged in an array near the signal pads, as for example in two or more rows parallel to the die edge. The area of the die on which the row or array of power/ground pads is disposed may be referred to herein as an "inboard region" of the die.

In another general aspect the invention features a semiconductor die having pad layout as described above.

In another general aspect the invention features a flip chip package including a semiconductor die having pad layout as described above, connected onto a substrate having interconnect pads arranged in a manner complementary to the die pad layout, in which the escape routing for the signal lines is formed in the upper metal layer, and the ground and power routing drops through vias to one or more lower metal layers.

In another general aspect the invention features a substrate for flip chip mount, having signal pads located in the margin of the die footprint, and having signal escape lines running in an upper metal layer outwardly and away from the die footprint; and having power pads and ground pads located inwardly from the signal pads and ground and power lines dropping through vias to lower metal layers. In some embodiments the signal pads are arranged in a row generally parallel to the edge of the die footprint. Or, the signal pads are arranged in an array, as for example in two or more rows parallel to the edge of the die footprint; in some such embodiments the pads in adjacent rows are staggered.

In some embodiments the ground and power pads are arranged in an array near the center of the die attach region; in some such embodiments the ground and power pads are arranged in a rectangular array, and in some embodiments a central area of the die attach region has no pads. Or, the power and ground pads are arranged near the signal pads; in some such embodiments the ground and power pads are arranged on a row parallel to the edge of the die footprint, and in some embodiments the ground and power pads are arranged in an array near the signal pads, as for example in two or more rows parallel to the edge of the die footprint.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly renumbered, although they are all readily identifiable in all the FIGS.

Figure 1:
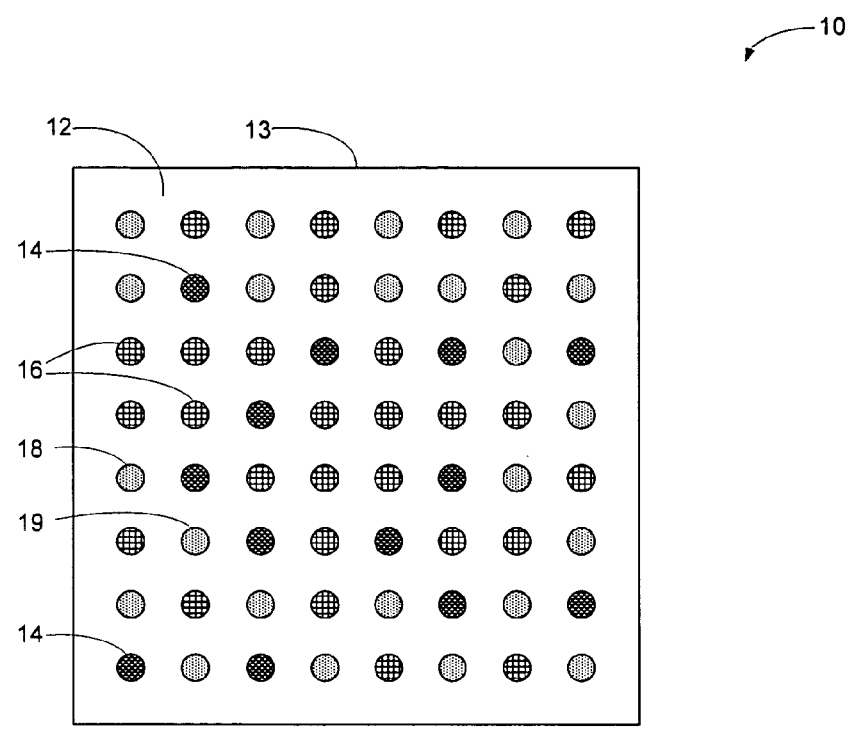
FIG. 1 is a diagrammatic sketch in a plan view showing a conventional pad layout on a die for a flip chip package.

In a conventional flip chip package, the input/output pads (collectively the "signal" pads) on the die are arranged in an area array substantially covering the active face 12 of the chip, as shown by way of illustration in a plan view generally at 10 in FIG. 1. The signal pads (e.g., 18, 19), power pads (e.g., 14), and ground pads (e.g., 16) (collectively the "power/ground pads"), directed respectively to the signal, power and ground functions of the die, are distributed throughout the multiple rows and columns within the array and, particularly, some of the signal pads (e.g., 18) are arranged on the perimeter of the array, while others (e.g., 19) are not. Ordinarily some design effort is made to arrange the pads so that the various signal pads are surrounded by, or at least adjacent to, power pads and/or ground pads.

Many conventional flip chip packages are made using ceramic substrates. Ceramic substrates can be made with a very large number of layers very inexpensively, and blind vias can be made in ceramic layers without difficulty. In a conventional chip as illustrated in FIG. 1, made for use with a conventional ceramic substrate, the pad pitch is typically is the range 150 μm to 250 μm, and a 225 μm grid pitch is typical of many chips.

Figure 2:
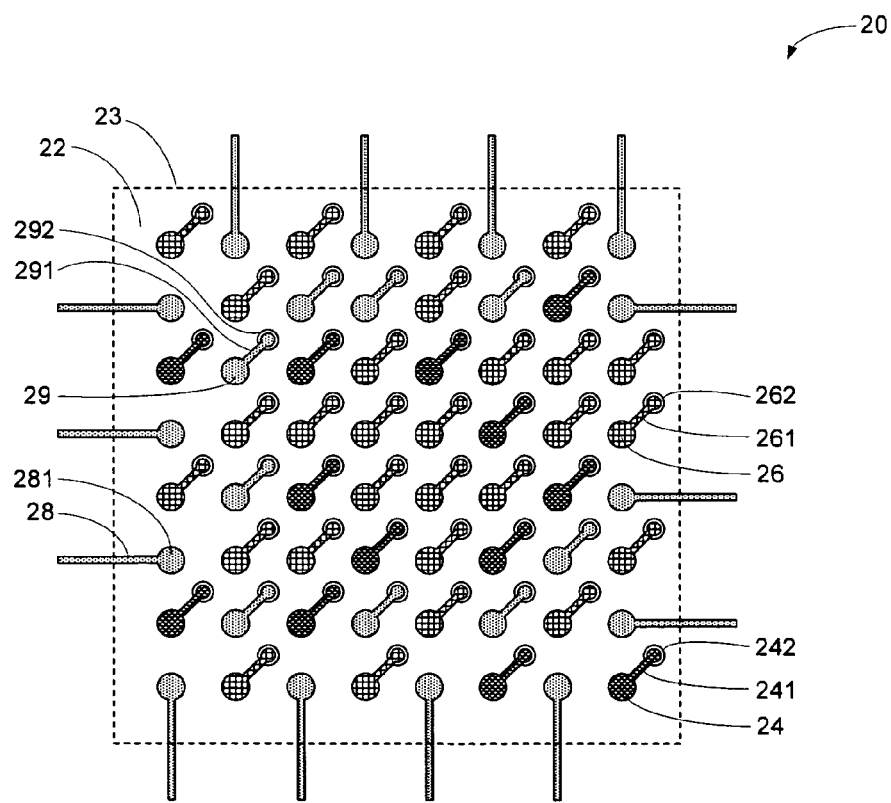
FIG. 2 is a diagrammatic sketch in a plan view showing an arrangement of pads and routing on a flip chip substrate corresponding to the die pad layout of FIG. 1.

Accordingly, in the conventional package the fan out routing in the substrate, that is, the wiring on the substrate that connects the corresponding pads on the substrate with the external terminals of the package, is implemented in multiple metal layers patterned to provide the signal wiring and power/ground wiring. An arrangement of substrate pads corresponding to the die pad layout of FIG. 1 is shown by way of illustration in a plan view generally at 20 in FIG. 2. The signal pads (e.g., 28, 29), power pads (e.g., 24), and ground pads (e.g., 26), are arranged in a complementary array on the substrate surface 22 so that they can receive and be bonded respectively to the signal, power and ground bumps attached to the corresponding pads on the die. In the conventional arrangement some of the pads associated with signal routing (e.g., 28) are at the perimeter of the array, while others are not (e.g., 29). Escape routing for the signal pads on the perimeter of the array can directly cross beneath the die edge (indicated at 23) as traces 281 in the uppermost metal layer of the substrate. Pads on the substrate that are not at the perimeter of the array are connected to deeper metal layers in the substrate by way of short traces and vias. In FIG. 2, for illustration, signal pads 29 are connected by way of short traces (signal "stubs" or "jogs") (e.g., 291) through signal vias (e.g., 292) to signal traces in one of several metal layers beneath; power pads 24 are connected by way of short traces (power "stubs" or "jogs") (e.g., 241) through power vias (e.g., 242) to power traces in a metal layer beneath; and ground pads 26 are connected by way of short traces (ground "stubs" or "jogs") (e.g., 261) through ground vias (e.g., 262) to power traces in a metal layer beneath.

In a typical conventional package having ~1000 external terminals, for example, there are at least 2 or 3 layers of signal wiring and at least 4 or 5 layers of power/ground wiring in the substrate, which leads to a total number of layers of approximately 6 or 8 or more. As a general rule, an increase in number of signal wiring layers requires a concomitant increase in power/ground layers owing to the need to maintain a transmission line electrical environment in the package; and this increases the total layer count still further. The need for additional layers also results in longer signal paths, and many layer-to-layer vias, adding undesirable electrical parasitics and deterioration of performance.

In some conventional configurations, the core circuitry is situated in an area about the center of the die, and the input/output circuitry is arranged in cells, arranged to one side of or around the core circuitry. The input/output cells are typically generally rectangular in shape, much longer than wide, and are arranged near the die edge and oriented with the longer dimension perpendicular to the die edge. A typical input/output cell has dimensions about 50 μm by 500 μm, although the cells can be made narrower for higher density interconnection.

Figure 3:
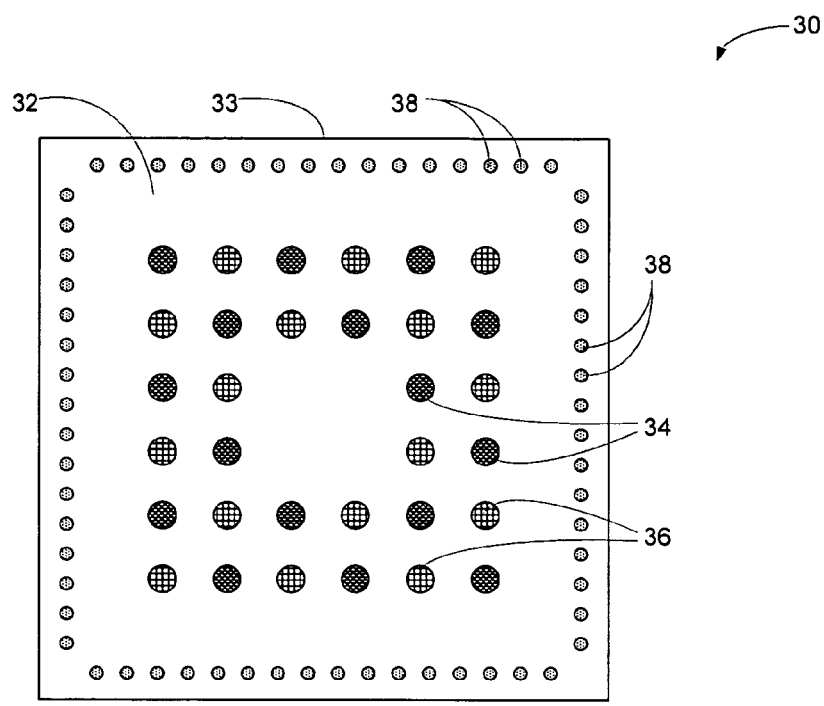
FIG. 3 is a diagrammatic sketch in a plan view showing a pad layout on a die for a flip chip package according to an embodiment of the invention.

FIG. 3 shows by way of example an embodiment of a die pad layout, generally at 30, according to the invention. The signal pads (e.g., 38) are in this example all arranged on the die surface 32 near the perimeter of the die, in rows parallel to the die edges 33. The signal pads have a finer pitch than the pads in the conventional mixed pad function array of FIG. 1. The power pads (e.g., 34) and ground pads (e.g., 36) are arranged in an array (here having a central area free of pads) on an inboard area of the die surface.

Figure 4:
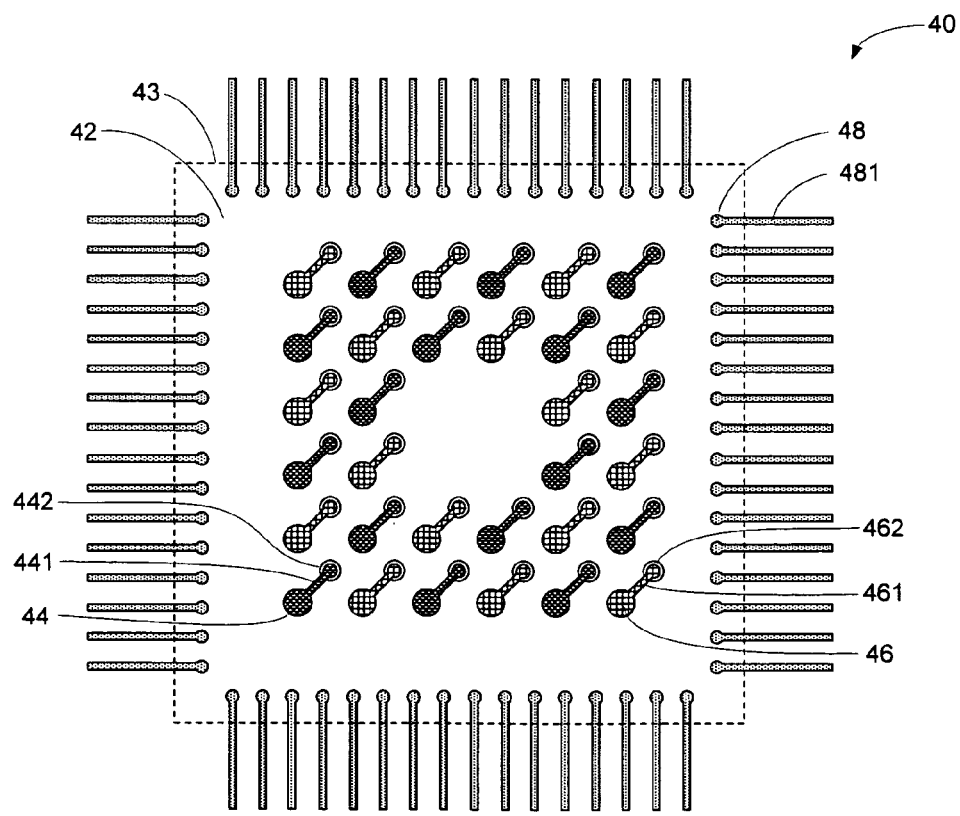
FIG. 4 is a diagrammatic sketch in a plan view showing an arrangement of pads and routing on a flip chip substrate corresponding to the die pad layout of FIG. 3 according to an embodiment of the invention.

An arrangement of substrate pads according to the invention, and corresponding to the die pad layout of FIG. 3 is shown by way of example in a plan view generally at 40 in FIG. 4. The signal pads (e.g., 48), power pads (e.g., 44), and ground pads (e.g., 46), are arranged in a complementary array on the substrate surface 42 so that they can receive and be bonded respectively to the signal, power and ground bumps attached to the corresponding pads on the die. In this arrangement according to the invention, all the pads associated with signal routing (e.g., 48) are at the perimeter of the array, and escape routing for the signal pads on the perimeter of the array can directly cross beneath the die edge (indicated at 43) as traces 481 in the uppermost metal layer of the substrate. Signal pads and power pads on the substrate, which in this example are not at the perimeter of the array, are connected to deeper metal layers in the substrate by way of short traces and vias. In FIG. 4, for illustration, power pads 44 are connected by way of short traces (power "stubs" or "jogs") (e.g., 441) through power vias (e.g., 442) to power traces in a metal layer beneath; and ground pads 46 are connected by way of short traces (ground "stubs" or "jogs") (e.g., 461) through ground vias (e.g., 462) to power traces in a metal layer beneath.

Generally, in the embodiment of FIGS. 3 and 4 according to the invention, all the signal lines are routed from the signal pads, passing away from the die footprint, and all the power and ground lines are routed to vias beneath the die footprint. Accordingly, no stubs or vias are required in the signal path, and parasitics in signal transmission are avoided. The signal traces can be made as close together as available techniques for trace formation allow, although as is well known if they are made too close signal interference may occur in adjacent lines. The signal pads may be made as close together as available techniques for trace formation and bump bonding allow.

Figure 5:
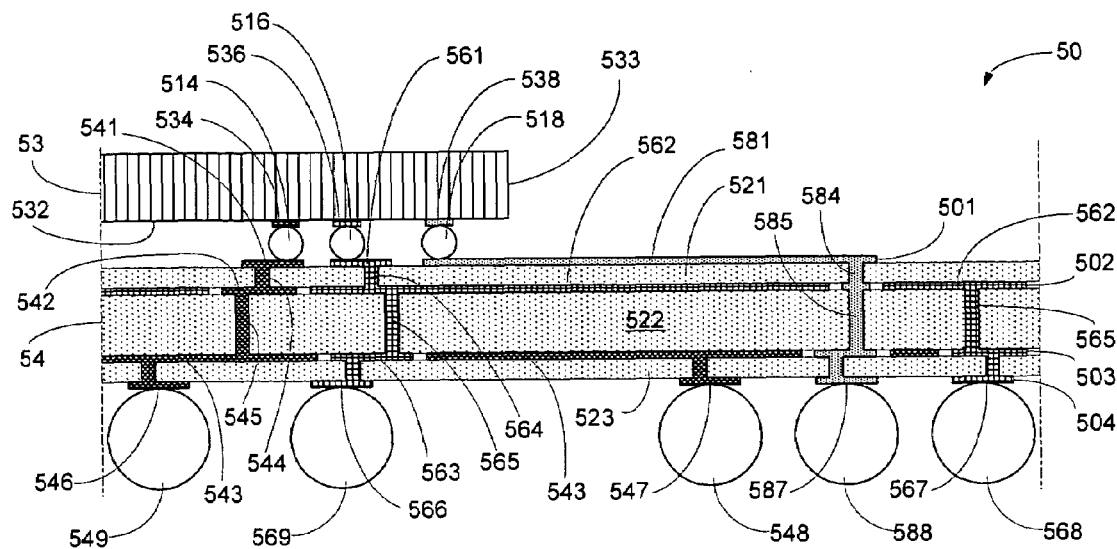
FIG. 5 is a diagrammatic sketch in an idealized sectional view showing a portion of a flip chip mounted on a substrate having a die pad layout and substrate pad arrangement according to the invention.

FIG. 5 shows, in a diagrammatic sectional view, a portion of a flip chip package, generally at 50, having a die 53 mounted on a die attach region of a surface of a substrate 54, having die pads and substrate pads and routing arranged according to an embodiment of the invention. The die pads (signal pads, e.g., 538; power pads, e.g., 534; and ground pads, e.g., 536) are formed on or in the active side 532 of die 53. Balls or bumps are attached to the die pads, and flip chip interconnection to the substrate is made by bonding the balls or bumps onto interconnect sites on corresponding patterned traces in the upper metal layer 501 of the substrate. Particularly, for example, signal bump 518 is attached to signal pad 538, and is bonded to sites on signal traces 581; power bump 514 is attached to power pad 534, and is bonded to sites on power traces 541; and ground bump 516 is attached to ground pad 536, and is bonded to sites on ground traces 561.

The substrate 54 is preferably a "build-up" type substrate, having one or more thinner alternating dielectric and metal layers (known as "build-up" layers) affixed onto each of the upper and lower surfaces of a thicker middle two-layer substrate (known as the "core"). The build-up substrate typically has the same number of single metal layers on the top as on the bottom. Thus a "1-2-1" build-up substrate has one thinner single metal layer affixed, with a dielectric layer, onto each the top and bottom of the core, making four metal layers in all; a "2-2-2" build-up substrate has two thinner single metal layers affixed, with dielectric layers, onto each the top and bottom of the core, making six metal layers in all; and a "3-2-3" build-up substrate has three thinner single metal layer substrates affixed, with dielectric layers, onto each the top and bottom of the core, making eight metal layers in all. Each additional set of build-up layers significantly raises the cost of the build-up substrate, and circuitry layouts that require fewer layers are accordingly desirable.

The build-up process can entail applying a dielectric material in a layer upon the surface of the core (or on the surface of a previously established build-up layer), for example by a spin-on process; then metallizing the surface of the dielectric, and patterning the metallization (for example by a mask and etch process).

A buildup substrate typically includes as a core a printed circuit board having patterned metal layers on top and bottom surfaces of a dielectric (hence, a "two metal layer" substrate). The thickness of the dielectric in such a printed circuit board is typically about 500 μm. As a practical matter, a features pitch in the metal layers on the core has a lower limit in the range about 100 μm, and the vias capture pad diameter has a lower limit in the range about 300 μm. The thickness of the dielectric in the thinner single build-up layers, by contrast, is typically about 50 μm. The metal layer on the build-up layers is typically thinner than those on the thicker core, and as a practical matter a features pitch in the metal layers in the build-up layers has a lower limit in the range about 50 μm, and the vias capture pad diameter has a lower limit in the range about 120 μm.

The substrate 54 in the embodiment of FIG. 5 is a four metal layer substrate of a build-up "1-2-1" type. That is, the substrate 54 includes upper and lower thin single metal layer substrates 521, 523 formed over middle thicker two metal layer substrate 522. The two metal layer substrate 522 has patterned upper and lower metal layers 502, 503. The single metal layer substrates 521, 523 have patterned metal layers 501, 504. Each of the patterned metal layers 501, 502, 503, 504 has traces for signal, power, and ground circuitry. For example, metal layer 502 includes traces 562 dedicated to ground circuitry and traces 542 dedicated to power circuitry; and metal layer 503 includes power traces 543 and ground traces 563.

Lower metal layer 504 is patterned to provide bonding sites for second level solder ball interconnection of the package at installation on, for example, a printed circuit board such as a motherboard (not shown in the FIG.) of a device. Particularly, ground balls 568, signal balls 588, and power balls 548 are attached to ground ball sites 567, signal ball sites 587, and power ball sites 547, arrayed on the margin of the underside of the package substrate 54. And, optionally, core ground balls 569 and core power balls 548 are attached to core ground ball sites 566 and core power ball sites 546, arrayed beneath the die on the underside of the package substrate 54.

Upper ground traces 561 and power traces 541 include sites for flip chip attachment of ground and power bumps 516, 514, and are connected by vias 564, 544 beneath the die footprint to traces 562, 542 in metal layer 502; and traces 562, 542 are connected by vias 565, 545 to traces 563, 543 in metal layer 503. Traces 563, 543 are, in turn, connected by vias to the second level interconnection sites 566, 546 (core ground and core power) and 567, 547 (ground and power).

According to the invention, the die signal pads 538 are arranged near the perimeter of the die, and the corresponding signal lines 581 on the substrate are routed beneath the die edge 533 away from the die footprint. As FIG. 5 shows, the signal traces 581 can be routed directly to areas of the substrate generally overlying the second level signal ball sites 587, so that the connection of the signal traces in the upper metal layer 501 to the ball sites 587 can be shortened and made principally by way of vias, for example 584, 585, with a minimum of signal circuitry within the lower metal layers 502, 503, 504. As may be desirable, the second level signal balls (and the vias running downward to them) can be situated between and near ground and power balls and vias.

Generally, ground lines in package substrates are preferably separated from signal lines by distances comparable to (at least of the same order of magnitude as) the distances between adjacent signal lines, so that field lines generated by signals go to ground rather than interfering with other signals. Preferably, therefore, in a package according to the invention the second metal layer operates principally as a ground plane, and the thickness of the dielectric in the upper metal layer is about equal to or less than the minimum spacing between adjacent signal lines on the upper layer. Accordingly, much of the fan-out ground circuitry for the package 50 is formed in the second metal layer 502, which is separated from the upper metal layer 501 only by the thin upper layer dielectric. In a 1-2-1 substrate as shown in FIG. 5 the thickness of the dielectric in the upper and lower single metal layer substrates may be about 50 μm, and so where the nominal distance between adjacent signal lines is about 50 μm or greater, a desirable spacing of ground and signal lines is obtained to provide a stable microstrip-controlled impedance transmission line environment for the signals.

As is discussed below, there are circumstances in which it may be preferred to have a small number of selected signal pads located among ground and power pads in an inboard area of the die, that is, within the core circuitry region of the die. Where the design demands, or where the die circuitry makes it more preferable, a signal pad located among ground or power pads within the core circuitry region of a die may have a corresponding pad on the substrate within the footprint of core circuitry region of the die, the die, and may be routed directly downward in a via through the substrate core more to a bottom layer.

Other build-up substrates can be employed according to the invention, although as noted above the cost rises significantly as additional layers are added, and substrates having fewer layers may be favored. Where a "2—2—2" substrate is used, the top and bottom build-up layers can be patterned much as is described above for a "1-2-1" substrate. The metal layers on the middle substrate can be employed primarily for power routing, and the metal layers on the build-up layers above and below the middle substrate can be employed principally as ground planes. Where greater numbers layers are employed in build-up substrates, the layout on the substrate layers may be arranged so that signal vias are, to the extent practicable, surrounded by ground and power vias, to reduce degradation of the signal by electrical parasitics.

A four-layer laminate substrate may be used, without build-up layers, providing the features pitch and via capture pad design fits within the coarse design rules of the core substrates. A conventional four-layer core laminate is sometimes referred to as a "0-4-0" substrate. Avoiding the necessity of build-up can provide a significant cost reduction in laminate preparation.

Other die pad layouts may be made according to the invention, having die signal pads arranged near the perimeter of the die, and die power and ground pads arranged on inboard from the signal pads; and other substrate arrangements may be made according to the invention, having signal pads arranged in a manner complementary to the die pad layout, and having signal lines routed from the signal pads beneath the die edge away from the die footprint and power and ground lines routed to vias beneath the die footprint. FIGS. 6A, 7A, 8A and 9A show three illustrative examples of pad layouts according to the invention, and FIGS. 6B, 7B, 8B and 9B show three illustrative examples of corresponding substrates according to the invention.

Figure 6A:
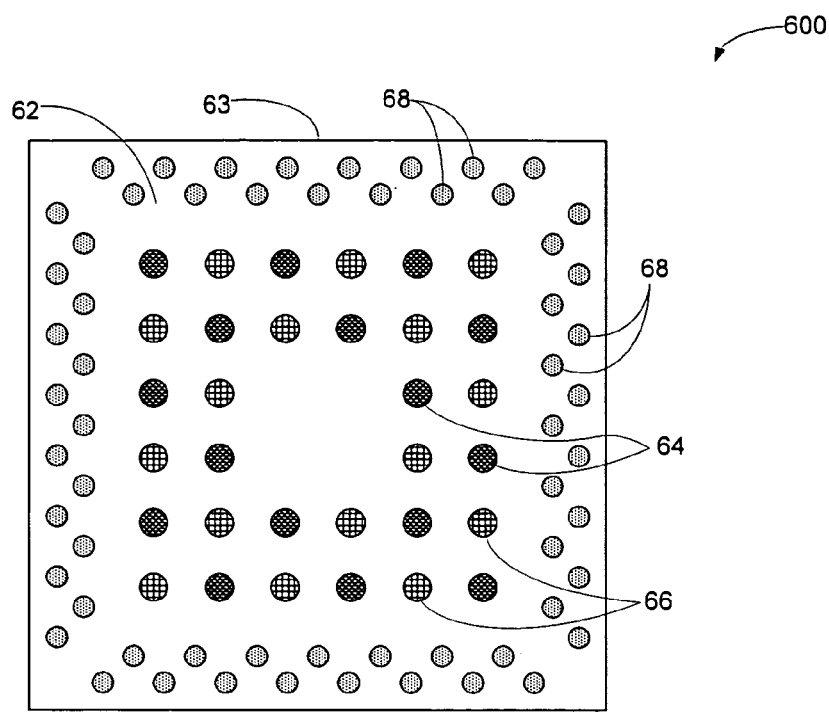
FIG. 6A is a diagrammatic sketch in a plan view showing a pad layout on a die for a flip chip package according to another embodiment of the invention.

Referring now to FIG. 6A, there is shown by way of example an embodiment of a die pad layout, generally at 600, according to the invention. The signal pads (e.g., 68) are in this example all arranged on the die surface 62 near the perimeter of the die, in an array of two staggered rows parallel to the die edges 63. The signal pads are shown having about the same pitch as the pads in a single row embodiment such as in FIG. 3 and, as a result, a much greater number of signal pads may be accommodated on the perimeter of the die. Alternatively, in some embodiments the same number of pads as in a single row embodiment can be accommodated in two rows and staggered so that the pad pitch and pad diameter (and the corresponding interconnect bumps or balls) may be greater, reducing manufacture costs. The power pads (e.g., 64) and ground pads (e.g., 66) in the embodiment of FIG. 6A are arranged in an array (here having a central area free of pads) on an inboard area of the die surface, as in the example of FIG. 3. It should be noted that many more die pads may be present in a typical die than are shown by way of illustration in the FIGS.; some die have several hundred pads, and a typical die, for example, may a total of 500 pads, including 150 power and ground pads, and 350 signal pads.

Figure 6B:
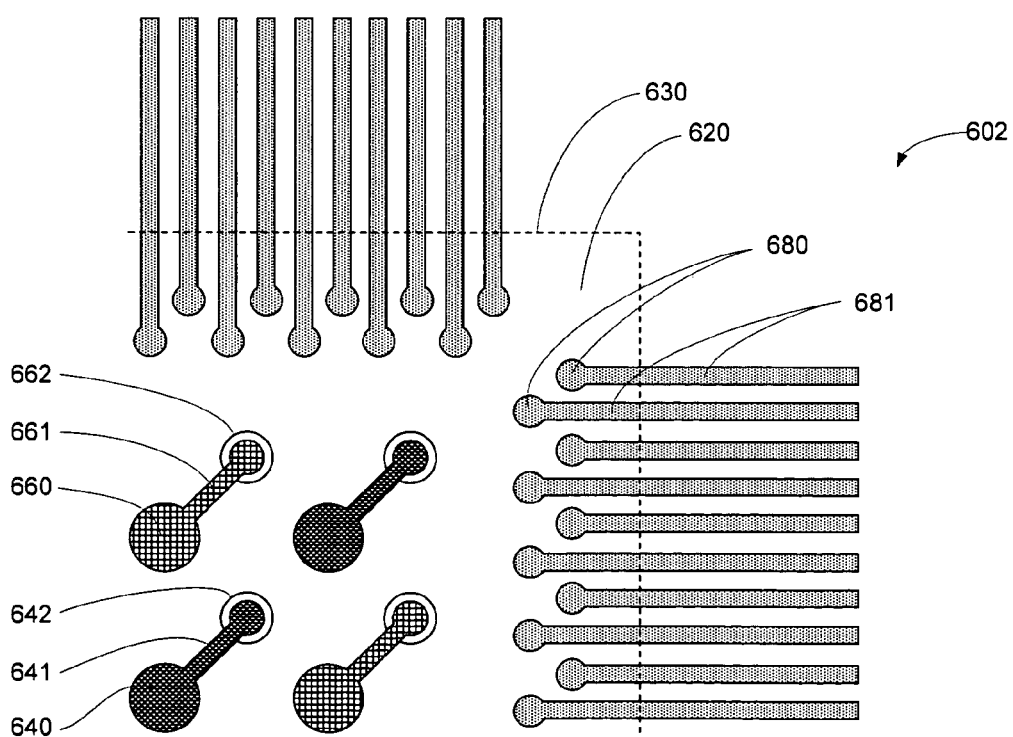
FIG. 6B is a diagrammatic sketch in a plan view showing a portion of an arrangement of pads and routing on a flip chip substrate corresponding to the die pad layout of FIG. 6A according to an embodiment of the invention.

An arrangement of substrate pads according to the invention, and corresponding to the die pad layout of FIG. 6A is shown by way of example in a plan view generally at 602 in FIG. 6B. The signal pads (e.g., 680), power pads (e.g., 640), and ground pads (e.g., 660), are arranged on the substrate surface 620 in an array complementary to the die pad layout of FIG. 6A, so that they can receive and be bonded respectively to the signal, power and ground bumps attached to the corresponding pads on the die 62. In this arrangement according to the invention, all the pads associated with signal routing (e.g., 680) are in an array of two staggered rows at the perimeter of the array, and escape routing for the signal pads on the perimeter of the array can directly cross beneath the die edge (indicated at 630) as traces 681 in the uppermost metal layer of the substrate. As FIG. 6B shows, although the signal pads 680 have about the same pitch as the pads in the embodiment of FIG. 4, the signal traces 681 have about half the pitch as do the signal traces 481 of the embodiment of FIG. 4. That is, the escape density can be doubled for a given pad pitch. Signal pads and power pads on the substrate, which in this example are not at the perimeter of the array, are connected to deeper metal layers in the substrate by way of short traces and vias. In FIG. 6B, for illustration, power pads 640 are connected by way of short traces (power "stubs" or "jogs") (e.g., 641) through power vias (e.g., 642) to power traces in a metal layer beneath; and ground pads 660 are connected by way of short traces (ground "stubs" or "jogs") (e.g., 661) through ground vias (e.g., 662) to power traces in a metal layer beneath.

Figure 7A:
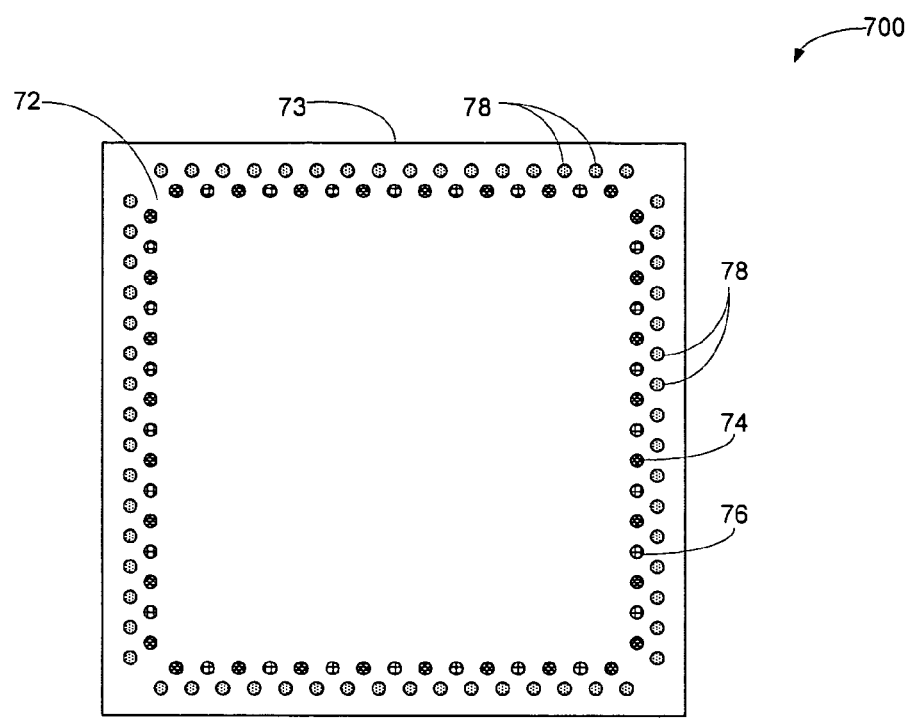
FIG. 7A is a diagrammatic sketch in a plan view showing a pad layout on a die for a flip chip package according to another embodiment of the invention.

FIG. 7A shows by way of example another embodiment of a die pad layout, generally at 700, according to the invention. The signal pads (e.g., 78) are in this example all arranged on the die surface 72 near the perimeter of the die, in a row parallel to the die edges 73. The signal pads are shown having about the same pitch as the pads in an embodiment such as in FIG. 3. Here, the power pads (e.g., 74) and ground pads (e.g., 76) are also arranged in a row, parallel to the die edge 73 and inboard of the row of signal pads 78. The power pads may, as illustrated here, alternate with the ground pads in the row; and all the pads may be formed more closely by staggering the pads in the inner row with the signal pads in the outer row.

Typically, the input/output circuitry in the active layer of the die is configured along the die perimeter, near one or more of the edges. Confining all the pads to rows near the perimeter of the die (forming a "pad ring") allows a reduction in the die cost by reducing the amount of on-die routing, and more conventional chip design tools can be employed in constructing the die.

Figure 7B:
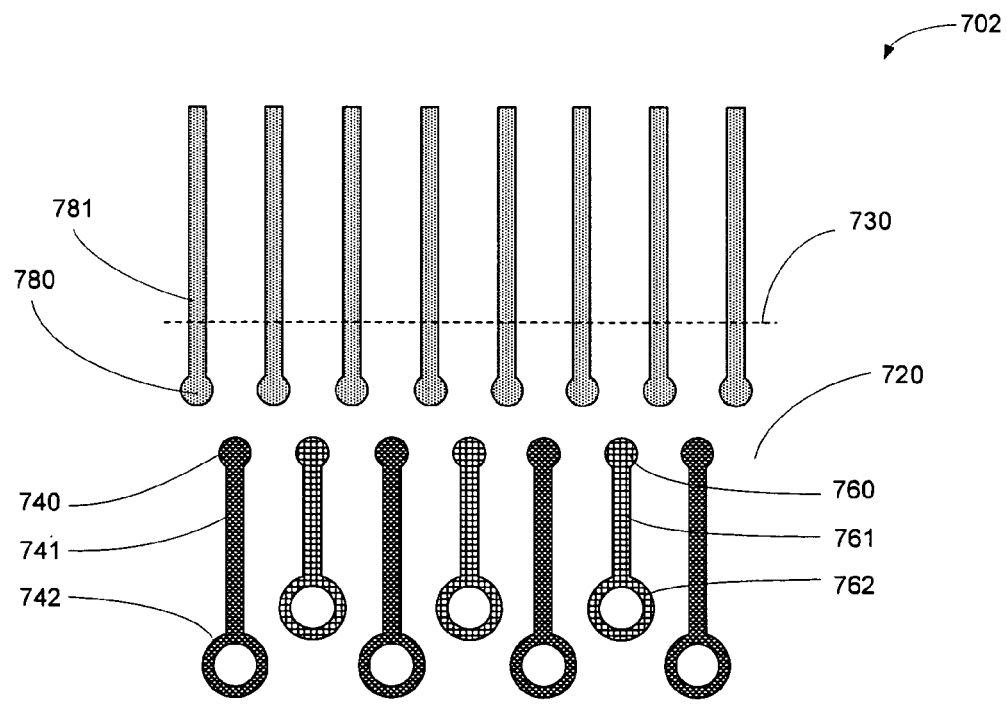
FIG. 7B is a diagrammatic sketch in a plan view showing a portion of an arrangement of pads and routing on a flip chip substrate corresponding to the die pad layout of FIG. 7A according to an embodiment of the invention.

An arrangement of substrate pads according to the invention, and corresponding to the die pad layout of FIG. 7A is shown by way of example in a plan view generally at 702 in FIG. 7B. The signal pads (e.g., 780), power pads (e.g., 740), and ground pads (e.g., 760), are arranged on the substrate surface 720 in an array complementary to the die pad layout of FIG. 7A, so that they can receive and be bonded respectively to the signal, power and ground bumps attached to the corresponding pads on the die 72. In this arrangement according to the invention, all the pads associated with signal routing (e.g., 780) are in a row at the perimeter of the array, and escape routing for the signal pads on the perimeter of the array can directly cross beneath the die edge (indicated at 730) as traces 781 in the uppermost metal layer of the substrate. Ground pads and power pads on the substrate, which in this example are inboard of the signal pads near the perimeter of the array, are connected to deeper metal layers in the substrate by way of short traces and vias. In FIG. 7B, for illustration, power pads 740 are connected by way of short traces (power "stubs" or "jogs") (e.g., 741) through power vias (e.g., 742) to power traces in a metal layer beneath; and ground pads 760 are connected by way of short traces (ground "stubs" or "jogs") (e.g., 761) through ground vias (e.g., 762) to power traces in a metal layer beneath.

In an arrangement generally as in FIGS. 7A and 7B, a small number of ground pads and/or a small number of power pads (that is, a small number of power/ground pads) can, in some embodiments, be situated in the outer row, nearer the die edge; and in the substrate ground pads and/or power pads can be arranged in a corresponding fashion. Configurations in which there are as many as 10% (more usually les than about 5%, still more usually 0% or less than about 2%) of ground and power pads in the outer row are within the invention, but locating power or ground pads in the outside row results in a reduction in the signal pad escape density. The signal pad escape density can be maximized according to the invention by minimizing the number of power or ground pads in the periphery of the pad, and in some preferred embodiments there are no power pads or ground pads in the outside row. Similarly, a small number of signal pads can be situated among the power and ground pads inward from the periphery of the die, and in the substrate the signal pads can be arranged in a corresponding fashion. However, such arrangements may require employing a lower (and in some deigns an additional) substrate layer, entailing the use of vias and increasing the signal path length.

As noted above, the signal pad escape density is maximized where the number of ground and/or power pads in the outer row are minimized and, accordingly the escape density can be at a maximum where there are no ground pads or power pads in the outer row. However, a signal pad that serves a particularly high frequency (high rf, for example) signal may have a ground pad adjacent on one side, or may be flanked on two sides by a signal pad and a ground pad, for example, for electromagnetic shielding of the signal. These present circumstances in which signal pad escape density may be traded off to a limited extent, and arranging power and/or ground pads on two or three sides of a signal pad near the periphery of the die may provide a useful compromise.

Figure 8A:
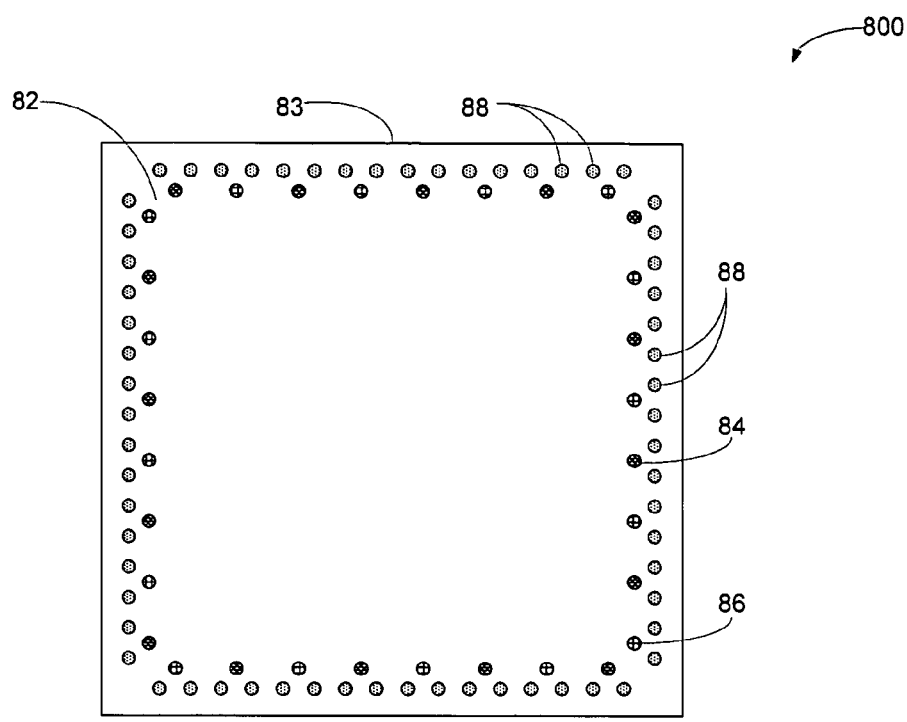
FIG. 8A is a diagrammatic sketch in a plan view showing a pad layout on a die for a flip chip package according to another embodiment of the invention.

Still another embodiment of a die pad layout of the invention is shown by way of example generally at 800 in FIG. 8A. The signal pads (e.g., 88) are in this example as in the example of FIG. 7A all arranged on the die surface 82 near the perimeter of the die, in a row parallel to the die edges 83. The signal pads are shown having about the same pitch as the pads in an embodiment such as in FIG. 3. Here, the power pads (e.g., 84) and ground pads (e.g., 86) are arranged in a row, parallel to the die edge 83 and inboard of the row of signal pads 88. In this example, the power pads and grounds pads have been "depopulated"; that is, there are (in this example) about half as many power and ground pads as in the Example of FIG. 7A. The power pads may, as illustrated here, alternate with the ground pads in the row; and all the pads may be formed more closely by staggering the pads in the inner row with the signal pads in the outer row.

Figure 8B:
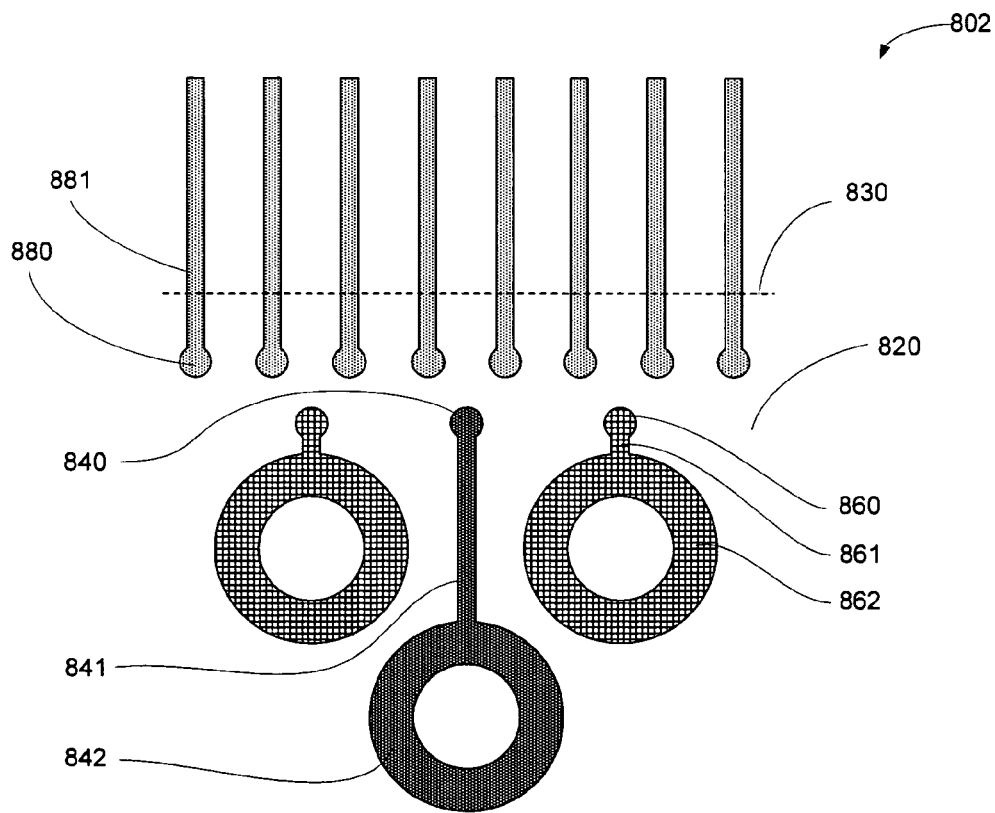
FIG. 8B is a diagrammatic sketch in a plan view showing a portion of an arrangement of pads and routing on a flip chip substrate corresponding to the die pad layout of FIG. 8A according to an embodiment of the invention.

Depopulating the power and ground pads allows for a layout having much larger ground vias and power vias under the shadow of the die, as illustrated by way of example in FIG. 8B, showing an arrangement of substrate pads according to the invention, and corresponding to the die pad layout of FIG. 8A, in a plan view generally at 802. The signal pads (e.g., 880), power pads (e.g., 840), and ground pads (e.g., 860), are arranged on the substrate surface 820 in an array complementary to the die pad layout of FIG. 8A, so that they can receive and be bonded respectively to the signal, power and ground bumps attached to the corresponding pads on the die 82. In this arrangement according to the invention, all the pads associated with signal routing (e.g., 880) are in a row at the perimeter of the array, and escape routing for the signal pads on the perimeter of the array can directly cross beneath the die edge (indicated at 830) as traces 881 in the uppermost metal layer of the substrate. Ground pads and power pads on the substrate, which in this example are inboard of the signal pads near the perimeter of the array, are connected to deeper metal layers in the substrate by way of short traces and vias. In FIG. 8B, for illustration, power pads 840 are connected by way of short traces (power "stubs" or "jogs") (e.g., 841) through power vias (e.g., 842) to power traces in a metal layer beneath; and ground pads 860 are connected by way of short traces (ground "stubs" or "jogs") (e.g., 861) through ground vias (e.g., 862) to power traces in a metal layer beneath.

The diameter of the ground and power vias is generally made about 2 to 3 times the line pitch. For greater power and ground via size, the alternating stubs can be of different lengths, so that the power and ground vias are in a staggered array as shown by way of example in FIG. 8B. Dimensions of some of the features of an exemplary embodiment as in FIG. 8B are as follows. For a signal line escape pitch, in this example, about 100 μm, an effective via pitch between the ground vias and power vias can be about 220 μm, and the via diameter can be as great as about 250 μm. Substrates having larger vias can be much less costly, and such a configuration can provide significant reductions in cost of the completed package.

Figure 9A:
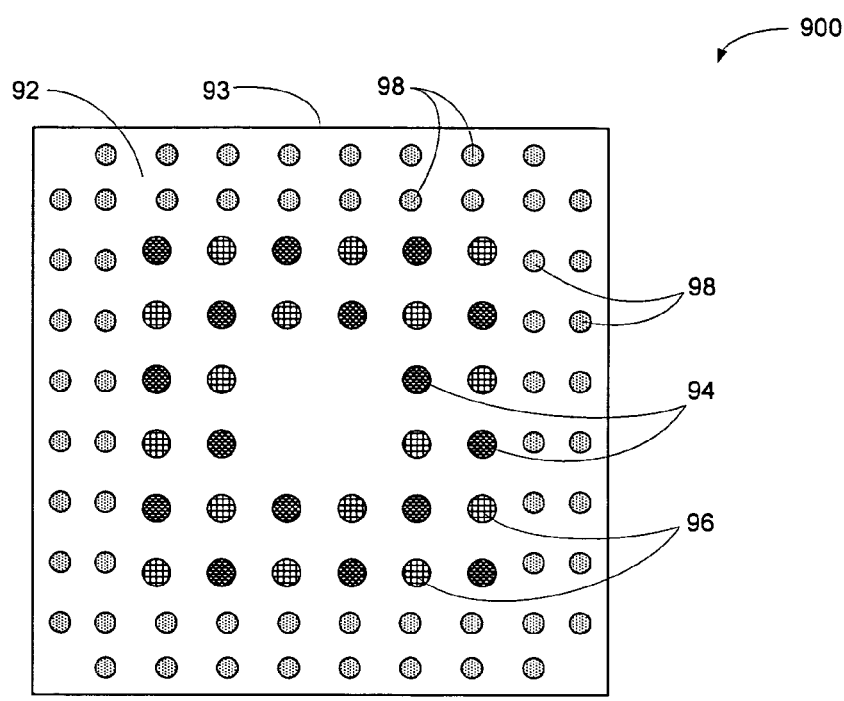
FIG. 9A is a diagrammatic sketch in a plan view showing a pad layout on a die for a flip chip package according to another embodiment of the invention.

Referring now to FIG. 9A, there is shown by way of example an embodiment of a die pad layout, generally at 900, according to the invention. The signal pads (e.g., 98) are in this example all arranged on the die surface 92 near the perimeter of the die, in a generally orthogonal array of two rows parallel to the die edges 93. The signal pads in each row are shown having about the same pitch as the pads in the outer row in the embodiment of FIG. 6, and the inner and outer rows are spaced somewhat farther apart than are adjacent pads in a single row embodiment such as in FIG. 3. There are, as a result, the same number of signal pads in the orthogonal perimeter array of FIG. 9A as in the staggered perimeter array of FIG. 6A. In the example of FIG. 9A, the orthogonal perimeter signal pitch array occupies slightly greater area than does the staggered perimeter signal pitch array of FIG. 6A; however, the pitch between nearest adjacent pads in the orthogonal array is less than the pitch between nearest adjacent pads in the staggered array, so that the interconnect geometries (pad pitch and pad diameter, and corresponding interconnect bumps or balls) may be greater, reducing manufacture costs.

The power pads (e.g., 94) and ground pads (e.g., 96) in the embodiment of FIG. 9A are arranged in an array (here having a central area free of pads) on an inboard area of the die surface, as in the example of FIGS. 3 and 6A.

Figure 9B:
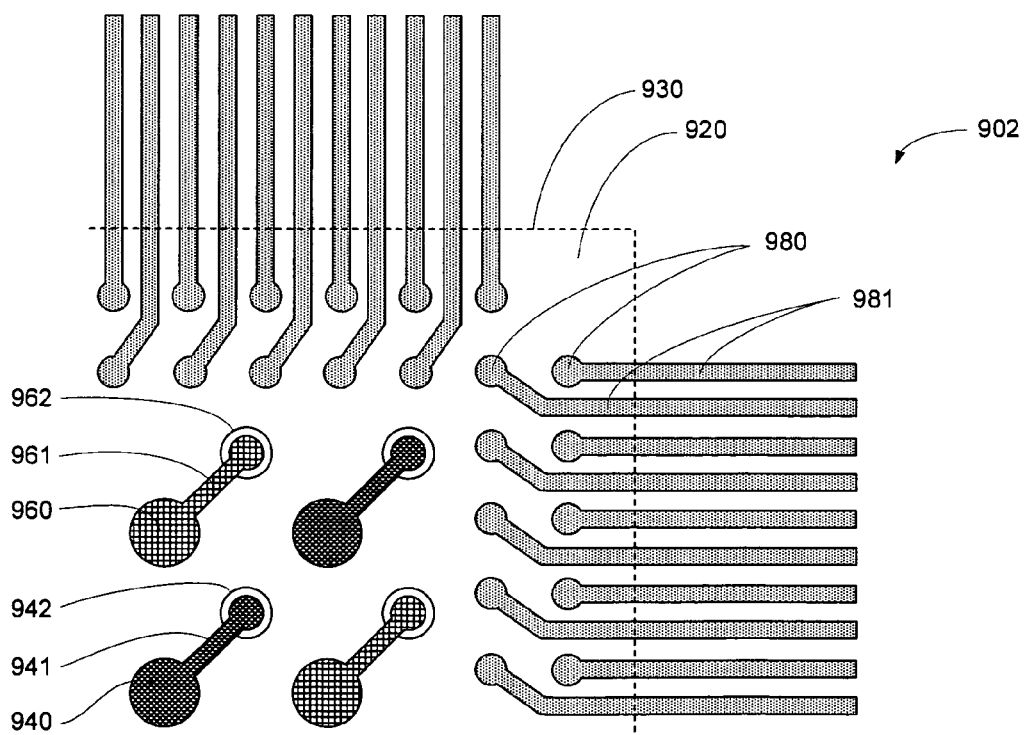
FIG. 9B is a diagrammatic sketch in a plan view showing a portion of an arrangement of pads and routing on a flip chip substrate corresponding to the die pad layout of FIG. 9A according to an embodiment of the invention.

An arrangement of substrate pads according to the invention, and corresponding to the die pad layout of FIG. 9A is shown by way of example in a plan view generally at 902 in FIG. 9B. The signal pads (e.g., 980), power pads (e.g., 940), and ground pads (e.g., 960), are arranged on the substrate surface 920 in an array complementary to the die pad layout of FIG. 9A, so that they can receive and be bonded respectively to the signal, power and ground bumps attached to the corresponding pads on the die 92. In this arrangement according to the invention, all the pads associated with signal routing (e.g., 980) are in an orthogonal array of two rows at the perimeter of the array, and escape routing for the signal pads on the perimeter of the array can directly cross beneath the die edge (indicated at 930) as traces 981 in the uppermost metal layer of the substrate. As FIG. 9B shows, the signal traces 981 have about the same pitch as do the signal traces 981 of the embodiment of FIG. 9B. Signal pads and power pads on the substrate, which in this example are not at the perimeter of the array, are connected to deeper metal layers in the substrate by way of short traces and vias. In FIG. 9B, for illustration, power pads 940 are connected by way of short traces (power "stubs" or "jogs") (e.g., 941) through power vias (e.g., 942) to power traces in a metal layer beneath; and ground pads 960 are connected by way of short traces (ground "stubs" or "jogs") (e.g., 961) through ground vias (e.g., 962) to power traces in a metal layer beneath.

Generally, as in other embodiments according to the invention, the signal lines in the embodiments of FIGS. 6B, 7B, 8B and 9B are routed from the signal pads, passing away from the die footprint, and all the power and ground lines are routed to vias beneath the die footprint. Signal traces can all be routed in a single upper metal layer on the substrate. Accordingly, no stubs or vias are required in the signal path, and parasitics in signal transmission are avoided. The signal traces can be made as close together as available techniques for trace formation allow, although as is well known if they are made too close signal interference may occur in adjacent lines. The signal pads may be made as close together as available techniques for trace formation and bump bonding allow.

The foregoing examples illustrate embodiments in which no ground or power interconnections are located among the signal interconnects nearest the perimeter of the die (and die footprint on the substrate); and in which no signal interconnects are located among the power and ground interconnections well within the core array about the middle of the die (and die footprint). As may be appreciated, in some circumstances it may be desirable to locate one or a few signal interconnections within the core array (usually, adjacent to ground interconnects) and, accordingly, to route one or a few signal lines in the substrate to a via beneath the die footprint, to connect with a lower metal layer in the substrate (or, usually less desirably, to route such signal lines in the upper metal layer of the substrate from well within the die footprint, and outward under the die edge). And, as may be appreciated, in some circumstances it may be desirable to locate one or a few power interconnections or, more usually, one or a few ground interconnections more peripherally, among the signal interconnections near the perimeter of the die and, accordingly, near the perimeter of the die footprint on the substrate. Just by way of example, it may be useful in some circuit designs to situate a clock signal interconnection nearer a ground interconnection. As may be appreciated from the foregoing, however, according to the invention all or substantially all the die signal pads are located in a row or in an array near the die perimeter; and all or substantially all the die power and ground pads are located inboard from substantially all the die signal pads. Particularly, the advantages of segregating signal pads near the perimeter from ground and power pads in the core can be significantly degraded as the number or proportion of non-segregated pads increases. According to the invention, the proportion of signal pads that are not in a perimeter row or a perimeter array is usually less than about 10% of all signal pads, more usually less than about 5% of all signal pads, and still more usually zero % or in the range zero % to about 2% of all signal pads. And, according to the invention, the proportion of ground or power pads that are not inboard from the perimeter row or perimeter array of signal pads is usually less than about 10% of all power and ground pads, more usually less than about 5% of all power and ground pads, and still more usually zero % or in the range zero % to about 2% of all signal pads.

In the examples shown in the FIGS., the signal pads are shown in a row or in an array along the entire perimeter of the die, that is, along all four edges of the rectangular (for example, square) die. In some embodiments the signal pads are arranged along fewer than all the die edges, and the advantages of the invention can be realized particularly in embodiments in which the signal pads are in a peripheral row or a peripheral array along any two or more of the four die edges.

According to the invention flip chip packages can be made using substrates having few layers, and circuitry on the various layers can be effectively allocated according to function, reducing substrate cost as well as improving performance.

Other embodiments are within the following claims.

What is claimed is:

1. A semiconductor chip, having a die pad layout for flip chip interconnect having signal pads disposed primarily in a perimeter region near an edge of the die, and having power/ground pads disposed primarily in an inboard region, wherein fewer than 10% of the power/ground pads are located within the perimeter region, and wherein fewer than 10% of the signal pads are located within the inboard region.

2. The semiconductor chip of claim 1 wherein the perimeter region consists essentially of a peripheral row generally parallel to a die edge.

3. The semiconductor chip of claim 1 wherein the perimeter region consists essentially of a peripheral array, generally parallel to a die edge.

4. The semiconductor chip of claim 3 signal pads are arranged primarily in at least two rows parallel to a die edge.

5. The semiconductor chip of claim 4 wherein the signal pads in adjacent rows are in a staggered arrangement.

6. The semiconductor chip of claim 4 wherein the signal pads in adjacent rows are in an orthogonal arrangement.

7. The semiconductor chip of claim 1 wherein the inboard region consists essentially of an array near the center of the die.

8. The semiconductor chip of claim 7 wherein the inboard region consists essentially of a rectangular array near the center of the die.

9. The semiconductor chip of claim 7 wherein a central area of the die has no pads.

10. The semiconductor chip of claim 9 wherein the power/ground pads are primarily arranged in at least two rows parallel to a die edge inboard from and near the signal pads.

11. The semiconductor chip of claim 1 wherein fewer than 5% of the power/ground pads are located within the perimeter region.

12. The semiconductor chip of claim 1 wherein fewer than 2% of the power/ground pads are located within the perimeter region.

13. The semiconductor chip of claim 1 wherein none of the power/ground pads is located within the perimeter region.

14. The semiconductor chip of claim 1 wherein fewer than 5% of the signal pads are located within the inboard region.

15. The semiconductor chip of claim 1 wherein fewer than 2% of the signal pads are located within the inboard region.

16. The semiconductor chip of claim 1 wherein none of the signal pads is located within the inboard region.

* * * * *